United States Patent
Kim et al.

(10) Patent No.: US 11,886,314 B2
(45) Date of Patent: Jan. 30, 2024

(54) MEMORY SYSTEM AND OPERATING METHOD THEREOF

(71) Applicant: SK hynix Inc., Icheon-si (KR)

(72) Inventors: Jung Ae Kim, Icheon-si (KR); Jee Yul Kim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 87 days.

(21) Appl. No.: 17/568,031

(22) Filed: Jan. 4, 2022

(65) Prior Publication Data

US 2023/0041076 A1 Feb. 9, 2023

(30) Foreign Application Priority Data

Aug. 5, 2021 (KR) .................. 10-2021-0103344

(51) Int. Cl.
*G06F 11/00* (2006.01)
*G06F 11/30* (2006.01)
*G06F 11/07* (2006.01)
*G11C 7/04* (2006.01)

(52) U.S. Cl.
CPC ........ *G06F 11/3037* (2013.01); *G06F 11/076* (2013.01); *G06F 11/0772* (2013.01); *G06F 11/3058* (2013.01); *G06F 11/3075* (2013.01); *G11C 7/04* (2013.01)

(58) Field of Classification Search
CPC ............. G06F 11/0703; G06F 11/0706; G06F 11/073; G06F 11/0754; G06F 11/076; G06F 11/0766; G06F 11/0772; G06F 11/3037; G06F 11/3058; G06F 11/3075; G06F 11/3089; G06F 3/0658; G06F 3/0679; G11C 7/04; G11C 16/0483; G11C 16/26; G11C 16/3418
See application file for complete search history.

(56) References Cited

U.S. PATENT DOCUMENTS

| | | | | |
|---|---|---|---|---|
| 5,875,142 A | * | 2/1999 | Chevallier | G11C 5/143 |
| | | | | 374/E7.035 |
| 7,006,943 B1 | * | 2/2006 | Mitchell | H01L 23/34 |
| | | | | 702/132 |
| 9,880,781 B2 | * | 1/2018 | Oh | G11C 7/1045 |

(Continued)

FOREIGN PATENT DOCUMENTS

| KR | 102083496 B1 | 3/2020 |
|---|---|---|
| KR | 102211126 B1 | 2/2021 |

*Primary Examiner* — Anthony J Amoroso
(74) *Attorney, Agent, or Firm* — Perkins Coie LLP

(57) ABSTRACT

A memory device is provided to include: a plurality of memory cells; a peripheral circuit configured to perform an operation on the plurality of memory cells; a temperature circuit configured to measure a temperature of the memory device; a monitoring component configured to generate, based on whether a measured temperature is within a reference range, monitoring information representing an operation mode that is either a normal mode in which the operation is performed or a protection mode in which the operation is suspended; and an operation controller configured to output a signal for controlling the operation according to the monitoring information. The monitoring component is further configured to store the monitoring information and output the monitoring information to the operation controller in response to receiving the measured temperature from the temperature circuit.

20 Claims, 11 Drawing Sheets

(56) References Cited

U.S. PATENT DOCUMENTS

| | | |
|---|---|---|
| 10,373,656 B2 * | 8/2019 | Takada ................ G06F 11/1048 |
| 10,770,150 B2 * | 9/2020 | Lee ....................... G11C 16/30 |
| 10,771,080 B1 * | 9/2020 | Bacigalupo .......... H03K 17/567 |
| 11,093,167 B2 * | 8/2021 | Masubuchi ............ G11C 5/144 |
| 11,243,711 B2 * | 2/2022 | Sato ........................ G11C 7/04 |
| 11,557,347 B2 * | 1/2023 | Wu .................... G11C 16/3418 |
| 11,635,777 B2 * | 4/2023 | Yeh .................... G01R 31/2874 |
| | | 219/497 |
| 2013/0103900 A1 * | 4/2013 | Chiu ................... G06F 11/3058 |
| | | 711/112 |
| 2015/0301932 A1 * | 10/2015 | Oh .......................... G06F 13/00 |
| | | 711/102 |
| 2020/0286804 A1 * | 9/2020 | Fallin .................... H01L 23/345 |

* cited by examiner

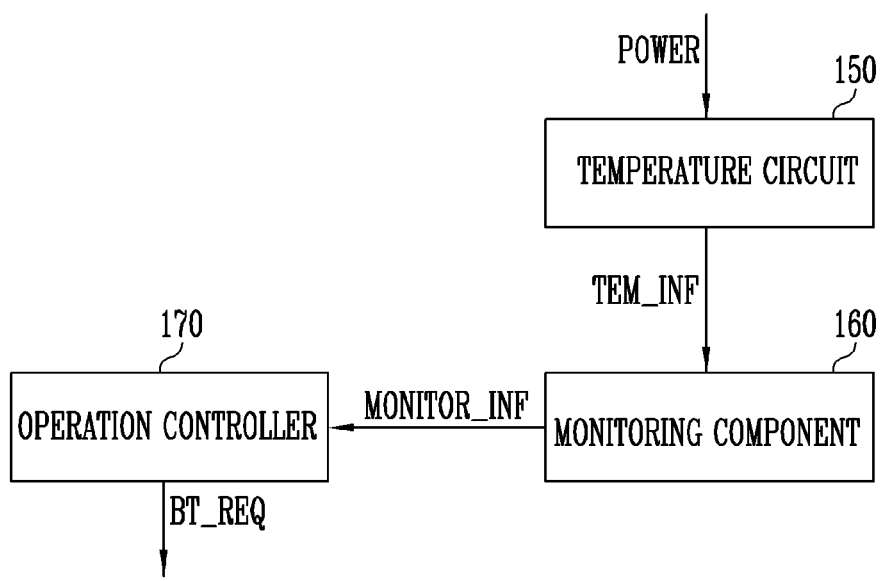

MEMORY SYSTEM AND OPERATING METHOD THEREOF

CROSS-REFERENCE TO RELATED APPLICATION

This patent document claims priority to and benefits of the Korean patent application number 10-2021-0103344, filed on Aug. 5, 2021, which is incorporated herein by reference in its entirety.

TECHNICAL FIELD

The technology and implementations disclosed in this patent document generally relate to an electronic device, and more particularly, to a memory device and an operating method thereof.

BACKGROUND

Storage devices refer to an electronic components device configured to store data based on a control of a host device such as a computer, a smart phone or a smart pad. The storage device includes a device configured to store data on a magnetic disk, such as a Hard Disk Drive (HDD), and a device configured to store data in a semiconductor memory, for example, a nonvolatile memory, such as a Solid State Drive (SSD) or a memory card.

The storage device may include a memory device configured to store data and a memory controller configured to control the memory device. The memory device is classified into a volatile memory device and a nonvolatile memory device depending on its capability to hold stored data in the absence of power. The nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), or a Ferroelectric RAM (FRAM).

SUMMARY

Embodiments of the disclosed technology provide a memory device for controlling an operation and an operating method of the memory device, based on temperature measurement results during and after a booting of a storage device.

In one aspect, a memory device is provided to include: a plurality of memory cells; a peripheral circuit configured to perform an operation on the plurality of memory cells; a temperature circuit configured to measure a temperature of the memory device; a monitoring component configured to generate, based on whether a measured temperature is within a reference range, monitoring information representing an operation mode that is either a normal mode in which the operation is performed or a protection mode in which the operation is suspended; and an operation controller configured to output a signal for controlling the operation according to the monitoring information. The monitoring component is further configured to store the monitoring information and output the monitoring information to the operation controller in response to receiving the measured temperature from the temperature circuit.

In another aspect, a method of operating a memory device is provided. The method includes: starting a booting operation for booting the memory device; measuring an initial temperature of the memory device in the booting operation; generating, based on whether the initial temperature is within a reference range, monitoring information representing either a booting mode in which the booting operation is continuously performed or a protection mode in which the booting operation is suspended; and outputting a request whether to continuously perform or suspend the booting operation based on the monitoring information.

In another aspect, a storage device is provided to include: a memory device including a plurality memory cells, each memory cell configured to store data; and a memory controller in communication with the memory device and configured to control an operation of the memory device. The memory device is configured to measure a temperature of the memory device and provide the memory controller with a signal representing an operation mode of the memory device that is either a normal mode in which the operation is performed or a protection mode in which the operation is suspended, the signal dependent on whether the temperature of the memory device is within a reference range.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein.

FIG. 4 is a diagram illustrating an operation of each component in a booting phase based on some implementations of the disclosed technology.

FIG. 5 is a diagram illustrating monitoring information generated by a monitoring component.

DETAILED DESCRIPTION

The specific structural or functional description disclosed herein is merely illustrative for describing examples of embodiments or implementations of the disclosed technology and should not be construed as limitations to the disclosed technology.

Figure 1:
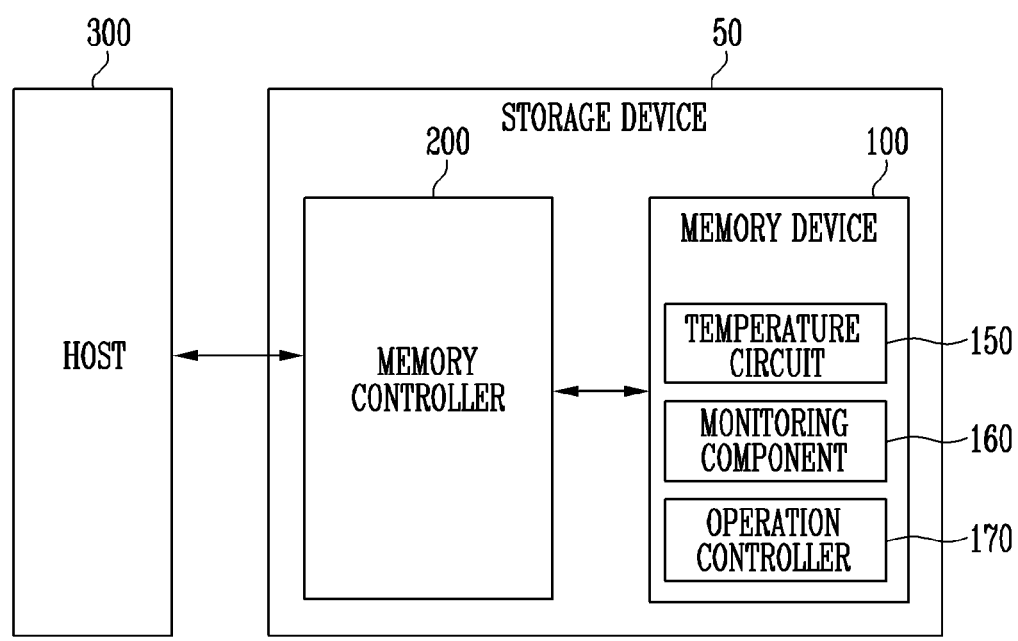
FIG. 1 is a block diagram illustrating a storage device based on some implementations of the disclosed technology.

FIG. 1 is a block diagram illustrating a storage device.

Referring to FIG. 1, the storage device 50 is a device for storing data and may include a memory device 100 and a memory controller 200 that is coupled to control an access by a host and an operation of the memory device 100.

The storage device 50 may be a device for storing data based on the control of a host 300, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates based on the control of the memory controller 200. The memory device 100 may include a memory cell array including a plurality of memory cells for storing data. The memory cell array may include a plurality of memory blocks. Each memory block may include a plurality of memory cells, and the plurality of memory cells may constitute a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or others. In this specification, for convenience of description, a case where the memory device 100 is a NAND flash memory is assumed and described.

In an embodiment, the memory device 100 may be implemented in a two-dimensional array structure or three-dimensional array structure. Hereinafter, although a case where the memory device 100 is implemented in the three-dimensional array structure is described as an embodiment, the present disclosure is not limited to the three-dimensional array structure. The present disclosure may be applied to not only a flash memory device in which a charge storage layer is configured with a Floating Gate (FG) but also a Charge Trap Flash (CTF) in which a charge storage layer is configured with an insulating layer.

In an embodiment, the memory device 100 may operate by using a Single Level Cell (SLC) method in which one data bit is stored in one memory cell. Alternatively, the memory device 100 may operate by using a method in which at least two data bits are stored in one memory cell. For example, the memory device 100 may operate by using a Multi-Level Cell (MLC) method in which two data bits are stored in one memory cell, a Triple Level Cell (TLC) method in which three data bits are stored in one memory cell, or a Quadruple Level Cell (QLC) method in which four data bits are stored in one memory cell.

The memory device 100 is configured to receive a command and an address from the memory controller 200 and access an area selected by the address in the memory cell array. Thus, the memory device 100 may perform an operation corresponding to the command on the area selected by the address. For example, the memory device 100 may perform a write (program) operation, a read operation, and an erase operation according to the received command. For example, when a program command is received, the memory device 100 may program data in the area selected by the address. When a read command is received, the memory device 100 may read data from the area selected by the address. When an erase command is received, the memory device 100 may erase data stored in the area selected by the address.

In an embodiment, the storage device 50 may be an automotive storage device 50 which may operate at −40° C. to 115° C. A temperature range in which the automotive storage device 50 can operate may be relatively wider than that in which a mobile storage device 50 can operate.

When the automotive storage device 50 is out of the temperature range in which the automotive storage device 50 can normally operate, the memory device 100 and the memory controller 200 malfunction. Therefore, in order to prevent the memory device 100 and the memory controller 200 from malfunctioning due to the temperature of the automotive storage device 50, firmware of the memory controller 200 may perform an operation for controlling the temperature. However, the capability of controlling the temperature using the firmware may be limited when the size of a code which the firmware can execute is limited.

Accordingly, some implementations of the disclosed technology suggest a method of measuring a temperature by operating a temperature circuit 150 in the memory device 100 in booting and after booting of the storage device 50. Some implementations of the disclosed technology further suggest autonomously suspending an operation of the memory device 100 based on the temperature and then notifying the suspension to the memory controller 200 when the measured temperature is out of a predetermined range.

In an embodiment, the memory device 100 may include the temperature circuit 150. The temperature circuit 150 may measure a temperature of the memory controller 200 and/or the memory device 100. In booting of the storage device 50, the temperature circuit 150 may measure a temperature.

Depending on the temperature measured during the booting of the storage device 50, the temperature circuit 150 may measure a temperature for every predetermined period. In some implementations of the disclosed technology, the temperature circuit 150 may measure a temperature for every predetermined period after the booting of the storage device 50. By measuring the temperature of the memory controller 200 and/or the memory device 100, the temperature circuit 150 provides an updated temperature information for every predetermined period. The temperature circuit 150 may generate and output temperature information including information on the measured temperature.

In an embodiment, the memory device 100 may include a monitoring component 160. The monitoring component 160 may monitor a state of the memory controller 200 and/or the memory device 100, based on the temperature information received from the temperature circuit 150. The state of the memory controller 200 and/or the memory device 100 may be either a state in which a booting mode (or a normal mode) can operate or a state in which a protection mode instead of the booting mode needs to operate. In the protection mode, an operation of the memory controller 200 and/or the memory device 100 is suspended.

The monitoring component 160 may generate monitoring information, based on a result obtained by monitoring the state of the memory controller 200 and/or the memory device 100. The monitoring information may represent an operation mode of the memory controller 200 and/or the memory device 100. The operation mode may be either the booting mode (or the normal mode) or the protection mode.

In an embodiment, the memory device 100 may include an operation controller 170. The operation controller 170 may control an operation, based on the monitoring information received from the monitoring component 160.

The operation controller 170 may operate based on the monitoring information received from the monitoring component 160. The monitoring information may be received in the booting of the storage device 50 and after the booting of the storage device. For example, when the monitoring information is received in the booting of the storage device 50 from the monitoring component 160 and represents the booting mode, the operation controller 170 may suspend a booting operation being performed by the memory device 100. When the monitoring information is received in the booting of the storage device 50 from the monitoring component 160 and represents the protection mode, the operation controller 170 may instruct the memory device 100 to continuously perform the booting operation. In some other implementations, when the monitoring information is received after the booting of the storage device 50, the operation controller 170 may suspend an operation of the memory device 100 or instruct the memory device to resume the suspended operation, based on the monitoring information received from the monitoring component 160.

The memory controller 200 may control overall operations of the storage device 50.

When a power voltage is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may include firmware (not shown) which receives data and a logical block address LBA from the host 300, and translates the logical block address LBA into a physical block address PBA representing addresses of memory cells included in the memory device 100, in which data is to be stored. Also, the memory controller 200 may store, in a buffer memory (not shown), a logical-physical address mapping table that establishes a mapping relationship between the logical block address LBA and the physical block address PBA.

The memory controller 200 may control the memory device 100 to perform a program operation, a read operation, an erase operation, or the like in response to a request from the host 300. For example, when a program request is received from the host 300, the memory controller 200 may change the program request into a program command, and provide the memory device 100 with the program command, a physical block address PBA, and data. When a read request is received together with a logical block address LBA from the host 300, the memory controller 200 may change the read request into a read command, select a physical block address PBA corresponding to the logical block address LBA, and then provide the memory device 100 with the read command and the physical block address PBA. When an erase request is received together with a logical block address LBA from the host 300, the memory controller 200 may change the erase request into an erase command, select a physical block address PBA corresponding to the logical block address LBA, and then provide the memory device 100 with the erase command and the physical block address PBA.

In an embodiment, the memory controller 200 may control at least two memory devices. The memory controller 200 may control the memory devices according to an interleaving scheme so as to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
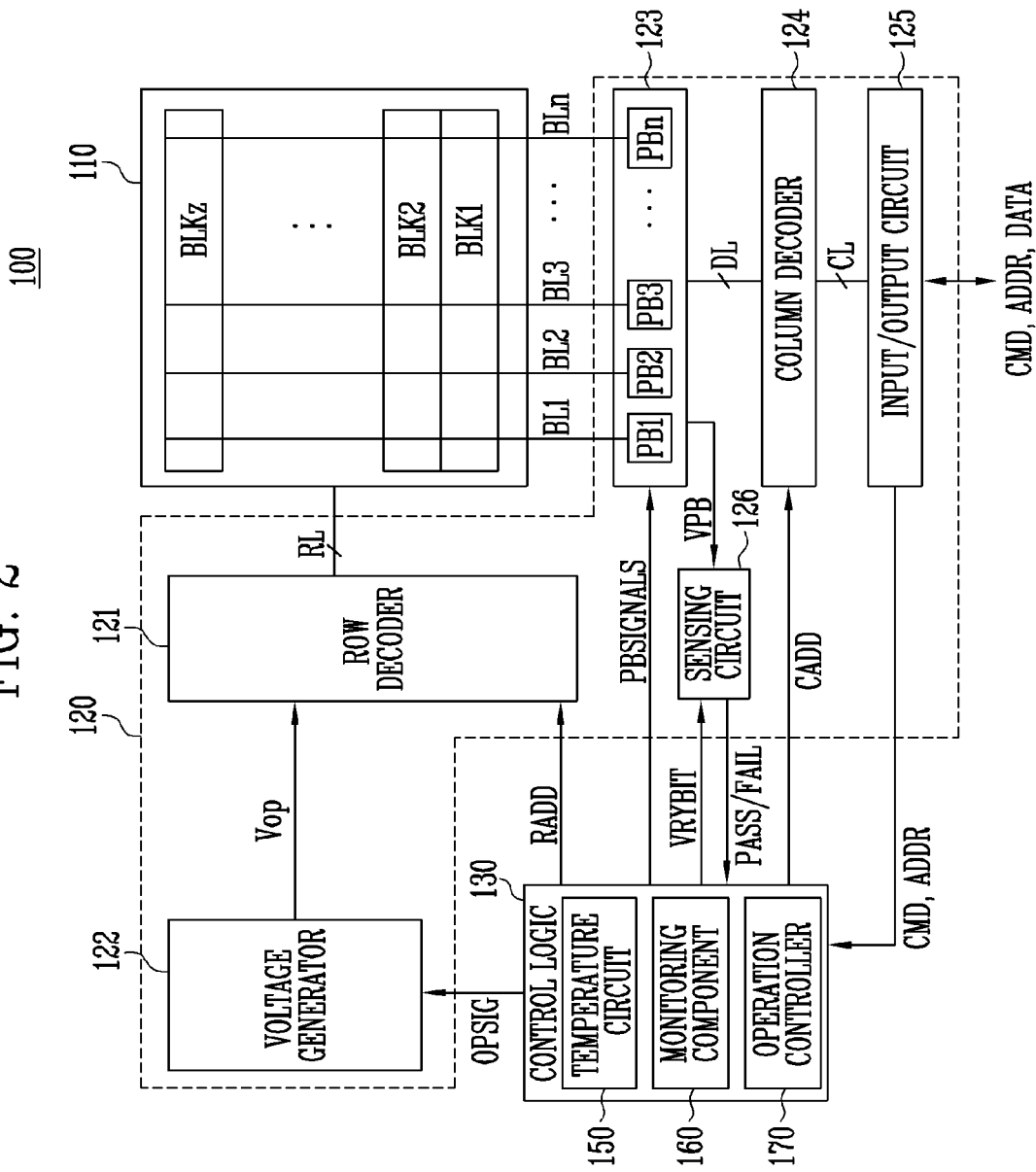
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 decodes a row address RADD received from the control logic 130. The row decoder 121 selects at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage to the unselected word line.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines connected to the selected memory block.

The voltage generator 122 operates under the control of the control logic 130. The voltage generator 122 generates a plurality of voltages by using an external power voltage supplied to the memory device 100. Specifically, the voltage generator 122 may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 includes first to nth page buffers PB1 to PBn. The first to nth page buffers PB1 to PBn are connected to the memory cell array 110 respectively through first to nth bit lines BL1 to BLn. The first to nth bit lines BL1 to BLn operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page are programmed according to the transferred data DATA. In a program verify operation, the first to nth page buffers PB1 to PBn read page data by sensing a voltage or current received from the selected memory cells through the first to nth bit lines BL1 to BLn.

In a read operation, the first to nth page buffers PB1 to PBn read data DATA from the memory cells of the selected page through the first to nth bit lines BL1 to BLn, and outputs the read data DATA to the input/output circuit 125 under the control of the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller (200 shown in FIG. 1), to the control logic 130, or exchange data DATA with the column decoder 124.

In a read operation or verify operation, the sensing circuit 125 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. For example, the control logic 130 may control a read operation of a selected memory block in response to a sub-block read command and an address. Also, the control logic 130 may control an erase operation of a selected sub-block included in the selected memory block in response to a sub-block erase command and an address. Also, the control logic 130 may determine whether the verify operation has passed or failed in response to the pass or fail signal PASS or FAIL.

In an embodiment, the control logic 130 may include a temperature circuit 150, a monitoring component 160, and an operation controller 170. In another embodiment, the temperature circuit 150, the monitoring component 160, and the operation controller 170 may be located at the outside of the control logic 130.

In an embodiment, the temperature circuit 150 may measure a temperature of the memory device 100. For example, the temperature circuit 150 may measure a temperature of the memory device 100 in booting. In some implementations, the temperature circuit 150 may measure a temperature of the memory device 100 for every predetermined period based on the temperature measured in the booting operation. In some implementations, the temperature circuit 150 may measure a temperature of the memory device 100 for every predetermined period after the booting. By measuring the temperature of the memory device 100, the temperature circuit 150 provides an updated temperature information for every predetermined period.

In an embodiment, the monitoring component 160 may monitor a state of the memory device 100, based on the temperature measured by the temperature circuit 150. For example, the monitoring component 160 may determine whether the memory device 100 is in a state in which it is necessary to suspend a booting operation being performed by the memory device 100 or a state in which CAM read operation on a CAM block included in the memory cell array 110 is possible, based on the temperature measured by the temperature circuit 150 in the booting.

Also, the monitoring component 160 may determine whether the memory device 100 is in a state in which it is necessary to suspend an operation of the memory device 100 or a state in which it is possible to resume the suspended operation, based on the temperature measured by the temperature circuit 150 after the booting.

In an embodiment, the monitoring component 160 may generate monitoring information, based on a result obtained by monitoring the state of the memory device 100.

In an embodiment, the operation controller 170 may control an operation to be performed by the memory device 100, based on the monitoring information.

For example, in the booting, the operation controller 170 may instruct the memory device 100 to suspend the booting operation being performed by the memory device 100 or instruct the memory device 100 to perform the CAM read operation on the CAM block included in the memory cell array 110, based on the monitoring information. Also, after the booting, the operation controller 170 may instruct the memory device to suspend the operation of the memory device 100 or instruct the memory device 100 to resume the suspended operation, based on the monitoring information.

Figure 3:
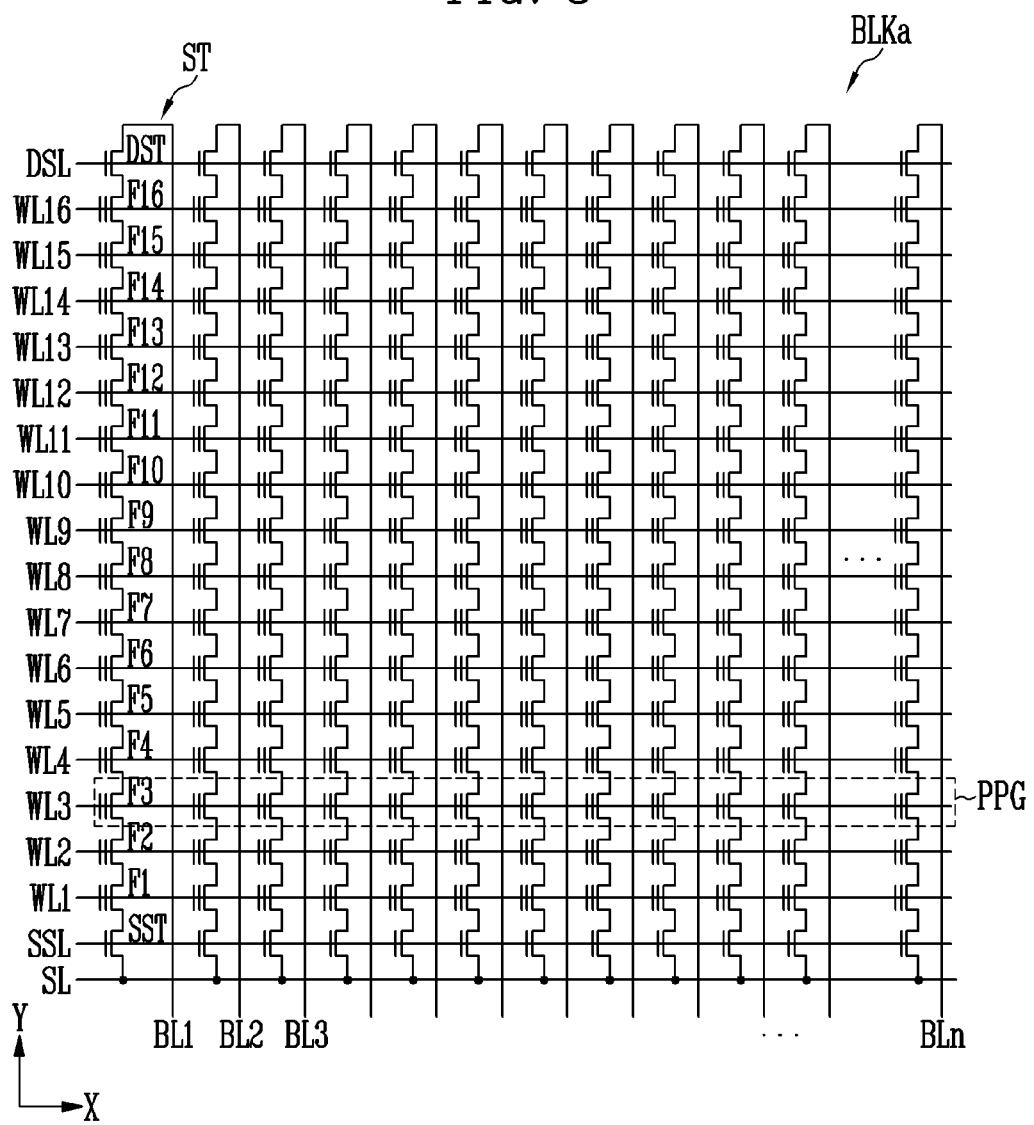
FIG. 3 is a diagram illustrating an embodiment of a memory cell array shown in FIG. 2.

FIG. 3 is a diagram illustrating an embodiment of the memory cell array shown in FIG. 2.

Referring to FIGS. 2 and 3, FIG. 3 is a circuit diagram illustrating any one memory block BLKa among the plurality of memory blocks BLK1 to BLKz included in the memory cell array 110 shown in FIG. 2.

In the memory block BLKa, a first select line, word lines, and a second select line, which are arranged in parallel, may be connected to each other. For example, the word lines may be arranged in parallel between the first and second select lines. The first select line may be a source select line SSL, and the second select line may be a drain select line DSL.

More specifically, the memory block BLKa may include a plurality of strings connected between bit lines BL1 to BLn and a source line SL. The bit lines BL1 to BLn may be respectively connected to the strings, and the source line SL may be commonly connected to the strings. The strings may be configured identically to one another, and therefore, a string ST connected to a first bit line BL1 will be described in detail as an example.

The string ST may include a source select transistor SST, a plurality of memory cells F1 to F16, and a drain select transistor DAT, which are connected in series to each other between the source line SL and the first bit line BL1. At least one source select transistor SST and at least one drain select transistor DST may be included in one string ST, and memory cells of which number is greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings may be connected to the source select line SSL, and gates of drain select transistors DST included in different strings may be connected to the drain select line DSL. Gates of the memory cells F1 to F116 may be connected to a plurality of word lines WL1 to WL16. A group of memory cells connected to the same word line among memory cells included in different strings may be referred to as a physical page PPG. Therefore, physical pages corresponding to the number of the word lines WL1 to WL16 may be included in the memory block BLKa.

One memory cell may store data of one bit. The memory cell is generally referred to as a single level cell (SLC). One physical page PPG may store one logical page (LPG) data. The one LPG data may include data bits of which number corresponds to that of cells included in one physical page PPG. Alternately, one memory cell MC may store data of two or more bits. The memory cell is generally referred to as a multi-level cell (MLC). One physical page PPG may store two or more LPG data.

A memory cell for storing data of two or more bits is referred to as the MLC. As the number of bits of data stored in one memory cell increases, the MLC has recently meant as a memory cell for storing data of two bits. A memory cell for storing data of three or more bits is referred to as a triple level cell (TLC), and a memory cell for storing data of four or more bits is referred to as a quadruple level cell (QLC). Besides, memory cells for storing data of a plurality of bits have been developed, and this embodiment may be applied to memory systems in which data of two or more bits are stored.

In another embodiment, each of the plurality of memory blocks may have a three-dimensional structure. Each memory block may include a plurality of memory cells stacked on a substrate. The plurality of memory cells may be arranged along +X, +Y, and +Z directions.

FIG. 4 is a diagram illustrating an operation of each component in a booting phase.

Referring to FIGS. 1 and 4, FIG. 4 illustrates the temperature circuit 150, the monitoring component 160, and the operation controller 170, which are included in the memory device (100 shown in FIG. 1). Also, FIG. 4 illustrates operations of the temperature circuit 150, the monitoring component 160, and the operation controller 170 during the booting operation of the storage device (50 shown in FIG. 1).

In an embodiment, when booting the storage device (50 shown in FIG. 1), external power POWER may be simultaneously supplied to the memory controller (200 shown in FIG. 1) and the memory device (100 shown in FIG. 1).

In an embodiment, when the external power POWER is supplied to the memory device (100 shown in FIG. 1), the temperature circuit 150 may measure a temperature of the memory device (100 shown in FIG. 1). The measured temperature may be within a predetermined temperature range or be out of the predetermined temperature range.

After the temperature circuit 150 measures the temperature of the memory device (100 shown in FIG. 1), the temperature circuit 150 may provide the monitoring component 160 with temperature information TEM_INF including information on the measured temperature.

In an embodiment, the monitoring component 160 may monitor a state of the memory device (100 shown in FIG. 1), based on the temperature information TEM_INF. The monitoring component 160 may generate monitoring information MONITOR_INF, based on a monitoring result. The monitoring information MONITOR_INF may include information whether the memory device is in a booting mode or a protection mode. The booting mode may be an operation mode of the memory device (100 shown in FIG. 1), in which a booting operation including a CAM read operation or others is performed, and the protection mode may be an operation mode of the memory device (100 shown in FIG. 1), in which the booting operation being performed is suspended.

The monitoring component 160 may store the monitoring information MONITOR_INF such that the memory device (100 shown in FIG. 1) operates in the booting mode or the protection mode, and then provide the monitoring information MONITOR_INF to the operation controller 170.

For example, when the measured temperature included in the temperature information TEM_INF is within the predetermined temperature range, the monitoring component 160 may store monitoring information MONITOR_INF including information on the booting mode and then provide the monitoring information MONITOR_INF to the operation controller 170.

In some other implementation, when the measured temperature included in the temperature information TEM_INF is not within the predetermined temperature range, the monitoring component 160 may store monitoring information MONITOR_INF including information on the protection mode and then provide the monitoring information MONITOR_INF to the operation controller 170.

In the example of FIG. 4, it is assumed that the measured temperature included in the temperature information TEM_INF is within the predetermined temperature range.

Therefore, the operation controller 170 may output a booting request BT_REQ for requesting the memory device (100 shown in FIG. 1) to continuously perform the booting operation, based on the monitoring information MONITOR_INF received from the monitoring component 160. When the booting request BT_REQ is output, the memory device (100 shown in FIG. 1) may perform a booting operation such as CAM read operation for reading data stored in a CAM block of the memory cell array (110 shown in FIG. 2).

FIG. 5 is a diagram illustrating monitoring information generated by the monitoring component.

Referring to FIGS. 4 and 5, FIG. 5 illustrates the monitoring information MONITOR_INF generated by the monitoring component (160 shown in FIG. 4). In FIG. 5, it is assumed that the predetermined temperature range of the memory device (100 shown in FIG. 1) is greater than or equal to T1 and is smaller than T2. Therefore, a temperature out of the predetermined temperature range may be smaller than T1 or be greater than or equal to T2.

In an embodiment, the monitoring component (160 shown in FIG. 4) may generate monitoring information MONITOR_INF, based on the temperature information TEM_INF received from the temperature circuit 150. The monitoring information MONITOR_INF may include information on a booting mode (or normal mode) or a protection mode.

In an embodiment, in a booting phase of the storage device (50 shown in FIG. 1), the monitoring component (160 shown in FIG. 4) may generate monitoring information MONITOR_INF including information on a booting mode BT_MODE or a protection mode PT_MODE, based on the temperature information TEM_INF received from the temperature circuit 150. The booting mode BT_MODE may be an operation mode of the memory device (100 shown in FIG. 1), in which a booting operation such as CAM read operation is performed, and the protection mode PT_MODE may be an operation mode of the memory device (100 shown in FIG. 1), in which the booting operation is suspended.

For example, in the booting phase of the storage device (50 shown in FIG. 1), when a temperature T_NAND of the memory device (100 shown in FIG. 1) is within a predetermined temperature range, the monitoring component (160 shown in FIG. 4) may generate monitoring information MONITOR_INF including information on the booting mode BT_MODE.

In some other implementations, in the booting phase of the storage device (50 shown in FIG. 1), when the temperature T_NAND of the memory device (100 shown in FIG. 1) is out of the predetermined temperature range, the monitoring component (160 shown in FIG. 4) may generate monitoring information MONITOR_INF including information on the protection mode PT_MODE.

In an embodiment, in a phase after the booting of the storage device (50 shown in FIG. 1), the monitoring component (160 shown in FIG. 4) may generate monitoring information MONITOR_INF including information on normal mode NM_MODE or a protection mode PT_MODE, based on the temperature information TEM_INF received from the temperature circuit 150. The normal mode NM_MODE may be a mode in which the memory device (100 shown in FIG. 1) performs an operation, and the protection mode PT_MODE may be a mode in which the memory device (100 shown in FIG. 1) suspends the operation.

For example, in the phase after the booting of the storage device (50 shown in FIG. 1), when the temperature T_NAND of the memory device is within the predetermined temperature range, the monitoring component (160 shown in FIG. 4) may generate monitoring information MONITOR_INF including information on the normal mode NM_MODE.

In some other implementations, in the phase after the booting of the storage device (50 shown in FIG. 1), when the temperature T_NAND of the memory device is out of the predetermined temperature range, the monitoring component (160 shown in FIG. 4) may generate monitoring information MONITOR_INF including information on the protection mode PT_MODE.

Figure 6:
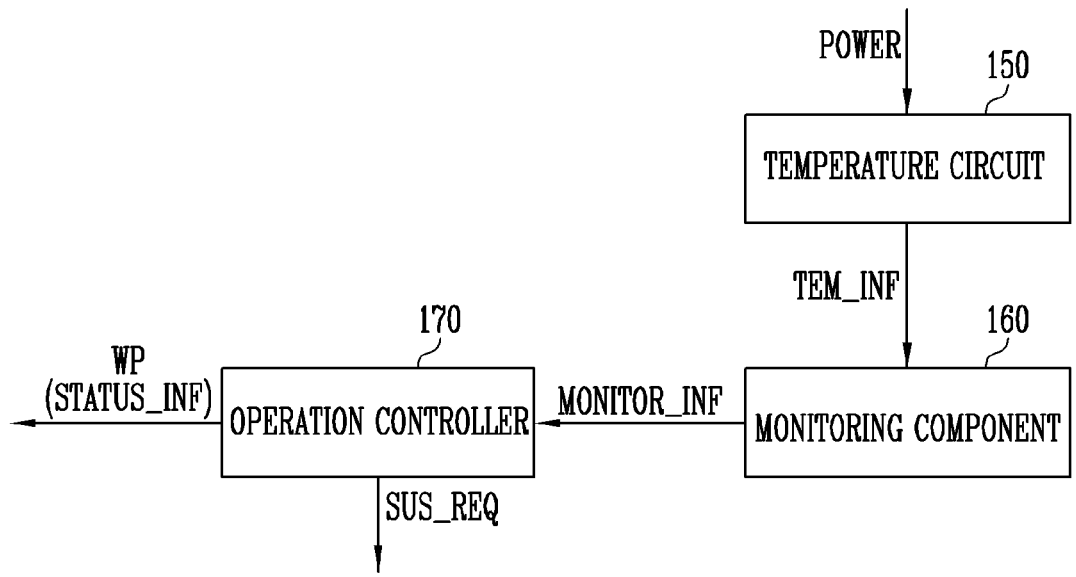
FIG. 6 is a diagram illustrating an operation of each component in the booting phase.

FIG. 6 is a diagram illustrating an operation of each component in the booting phase.

Referring to FIGS. 1 and 6, FIG. 6 illustrates the temperature circuit 150, the monitoring component 160, and the operation controller 170, which are included in the memory device (100 shown in FIG. 1). Also, FIG. 6 illustrates operations of the temperature circuit 150, the monitoring component 160, and the operation controller 170 during the booting operation of the storage device (50 shown in FIG. 1).

Unlike the example of FIG. 4, in the example of FIG. 6, it is assumed that the measured temperature included in the temperature information TEM_INF is out of the predetermined temperature range.

With reference to FIG. 6, the same operations as those performed in the example of FIG. 4 will not be repeatedly discussed and the operation(s) different from those in the example of FIG. 4 will be mainly discussed.

In an embodiment, when the external power POWER is supplied to the memory device (100 shown in FIG. 6), the temperature circuit 150 may measure a temperature of the memory device (100 shown in FIG. 6). In the example of FIG. 6, the measured temperature may be out of the predetermined temperature range.

The monitoring component 160 may monitor a state of the memory device (100 shown in FIG. 1), based on the temperature information TEM_INF received from the temperature circuit 150, and store monitoring information MONITOR_INF including information on a protection mode and then provide the monitoring information MONITOR_INF to the operation controller 170, based on a monitoring result. The protection mode may be an operation mode in which a booting operation being performed by the memory device (100 shown in FIG. 1) is suspended.

In an embodiment, the operation controller 170 may output a suspend request SUS_REQ for requesting the memory device (100 shown in FIG. 1) to suspend the booting operation, based on the monitoring information MONITOR_INF received from the monitoring component 160. When the suspend request SUS_REQ is output, the memory device (100 shown in FIG. 1) may suspend the booting operation.

In some implementations, in order to notify the memory controller (200 shown in FIG. 1) of that the temperature of the memory device (100 shown in FIG. 1) is out of the predetermined temperature range, the operation controller 170 may output a write prevention signal WP or status information STATUS_INF, based on the monitoring information MONITOR_INF.

For example, when the monitoring information MONITOR_INF includes the information on the protection mode, the operation controller 170 may output the write prevention signal WP as a high state or a low state through a write prevention line WP #, thereby notifying the memory controller (200 shown in FIG. 1) of that the memory device (100 shown in FIG. 1) operates in the protection mode.

The write prevention signal WP will be described in more detail with reference to FIGS. 7 and 8.

In some implementations, the operation controller 170 may allow the information on the protection mode to be included in the status information STATUS_INF and then output the status information STATUS_INF to the memory controller (200 shown in FIG. 1), thereby notifying the memory controller (200 shown in FIG. 1) of that the memory device (100 shown in FIG. 1) operates in the protection mode. The operation controller 170 may output the status information STATUS_INF to the memory controller (200 shown in FIG. 1), when the memory device (100 shown in FIG. 1) is reset. The memory device (100 shown in FIG. 1) may be reset when the state of the memory device (100 shown in FIG. 1) is changed from a sleep state to a wakeup state, and the memory device (100 shown in FIG. 1) does not normally operate in the wakeup state.

In an embodiment, after the memory device (100 shown in FIG. 1) suspends the booting operation, the temperature circuit 150 may measure a temperature of the memory device (100 shown in FIG. 1) for every predetermined period. In addition, the monitoring component 160 may receive temperature information TEM_INF from the temperature circuit 150 for every predetermined period. Thus, after the memory device (100 shown in FIG. 1) suspends the booting operation, the temperature circuit 150 provides an updated temperature information for every predetermined period.

Upon receiving the updated temperature information, the monitoring component 160 may determine whether the temperature of the memory device (100 shown in FIG. 1) is within the predetermined temperature range based on the temperature information TEM_INF received from the temperature circuit 150. When it is determined that the temperature of the memory device (100 shown in FIG. 1) is within the predetermined temperature range, the monitoring component 160 may generate and store monitoring information MONITOR_INF including information on a booting mode BT_MODE.

When the monitoring component 160 generates and stores monitoring information MONITOR_INF, such monitoring information MONITOR_INF may be stored in the monitoring component 160 instead of the previously stored monitoring information MONITOR_INF. When the monitoring information MONITOR_INF corresponding to the updated temperature information is stored, the monitoring component 160 may output newly stored monitoring information MONITOR_INF to the operation controller 170. Thus, whenever the stored monitoring information MONITOR_INF is changed, the monitoring component 160 may output the changed monitoring information MONITOR_INF to the operation controller 170.

Subsequently, the operation controller 170 may output a booting request BT_REQ for requesting the memory device (100 shown in FIG. 1) to resume the suspended booting operation, based on the monitoring information MONITOR_INF received from the monitoring component 160. When the booting request BT_REQ is output, the memory device (100 shown in FIG. 1) may resume the booting operation such as CAM read operation for reading data stored in a CAM block.

Figure 7:
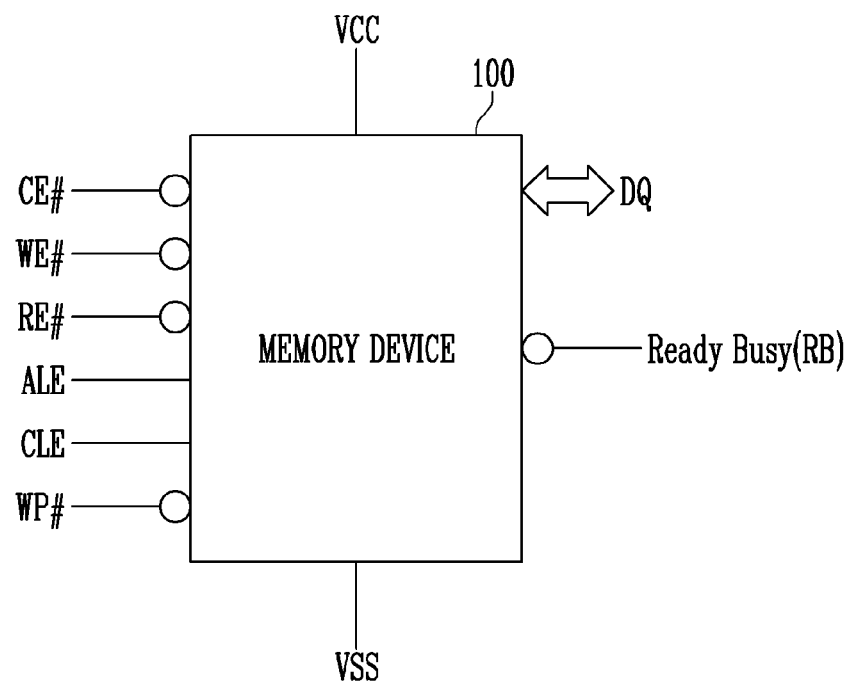
FIG. 7 is a diagram illustrating a pin configuration of the memory device shown in FIG. 1.

FIG. 7 is a diagram illustrating a pin configuration of the memory device shown in FIG. 1.

Referring to FIG. 7, the memory device (100 shown in FIG. 1) may communicate with an external controller through a plurality of input/output lines. For example, the memory device (100 shown in FIG. 1) may communicate with the external controller through control signal lines including a chip enable line CE #, a write enable line WE #, a read enable line RE #, an address latch enable line ALE, a command latch enable line CLE, a write prevention line WP #, and a ready busy line RB, and data input/output lines DQ.

The memory device (100 shown in FIG. 1) may receive a chip enable signal from the external controller through the chip enable line CE #. The memory device (100 shown in FIG. 1) may receive a write enable signal from the external controller through the write enable line WE #. The memory device may receive a read enable signal from the external controller through the read enable line RE #. The memory device (100 shown in FIG. 1) may receive an address latch enable signal from the external controller through the address latch enable line ALE. The memory device (100 shown in FIG. 1) may receive a command latch enable signal from the external controller through the command latch enable line CLE. The memory device (100 shown in FIG. 1) may receive a write prevention signal from the external controller through the write prevention line WP #.

In an embodiment, the memory device (100 shown in FIG. 1) may provide the memory controller (200 shown in FIG. 1) with a ready busy signal for outputting whether the memory device (100 shown in FIG. 1) is in a ready state or a busy state, through the ready busy line RB.

The chip enable signal may be a control signal for selecting the memory device (100 shown in FIG. 1). When the chip enable signal is in a 'high' state, and the memory device (100 shown in FIG. 1) corresponds to the 'ready' state, the memory device (100 shown in FIG. 1) may enter into a low power standby state.

The write enable signal may be a control signal for controlling a command, an address, and input data, which are input to the memory device (100 shown in FIG. 1), to be stored in a latch.

The read enable signal may be a control signal for enabling the output of serial data.

The address latch enable signal may be one of control signals used by a host to represent which one of a command, an address, and data the type of a signal input through the input/output lines DQ is.

The command latch enable signal may be one of control signals used by the host to represent which one of the command, the address, and the data the type of a signal input through the input/output lines DQ is.

For example, when the command latch enable signal is activated (e.g., logic high), the address latch enable signal is inactivated (e.g., logic low), and the write enable signal is activated (e.g., logic low) and then inactivated (e.g., logic high), the memory device (100 shown in FIG. 1) may identify that the signal input through the input/output lines DQ is a command.

For example, when the command latch enable signal is inactivated (e.g., logic low), the address latch enable signal is activated (e.g., logic high), and the write enable signal is activated (e.g., logic low) and then inactivated (e.g., logic high), the memory device (100 shown in FIG. 1) may identify that the signal input through the input/output lines DQ is an address.

The write prevention signal may be a control signal for inactivating a program operation and an erase operation, which are performed by the memory device (100 shown in FIG. 1).

The ready busy signal may be a signal for identifying a state of the memory device (100 shown in FIG. 1). The ready busy signal in a low state represents that the memory device (100 shown in FIG. 1) is performing at least one operation. The ready busy signal in a high state represents that the memory device (100 shown in FIG. 1) is not performing any operation.

The ready busy signal may be in the low state while the memory device (100 shown in FIG. 1) is performing any one of a program operation, a read operation, and the erase operation. In an embodiment of the present disclosure, the memory controller (200 shown in FIG. 1) may determine an end time that is a time at which a program operation or erase operation is ended based on the ready busy signal.

In an embodiment, the memory device (100 shown in FIG. 1) may output the write prevention signal to the external controller through the write prevention line WP #. Specifically, the memory device (100 shown in FIG. 1) may output the write prevention signal as a high state or a low state, thereby notifying the external controller of that the memory device (100 shown in FIG. 1) operates a booting mode (or normal mode) or a protection mode.

Figure 8:
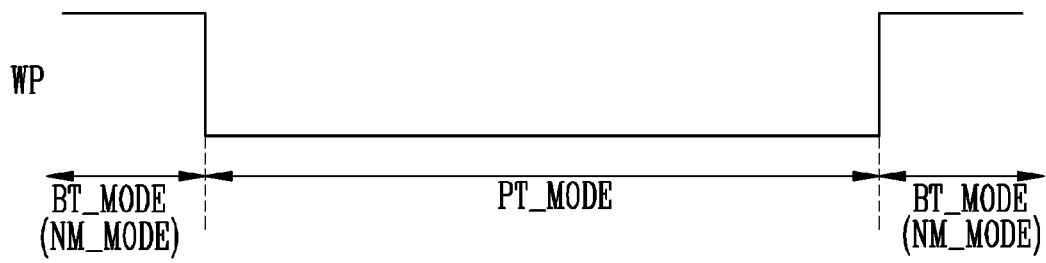
FIG. 8 is a diagram illustrating a method of notifying an operation mode of the memory device through a write prevention signal.

FIG. 8 is a diagram illustrating a method of notifying an operation mode of the memory device through the write prevention signal.

Referring to FIGS. 7 and 8, FIG. 8 illustrates the write prevention signal WP output to the memory controller (200 shown in FIG. 1) through the write prevention line WP #shown in FIG. 7.

In an embodiment, the operation controller (170 shown in FIG. 1) may generate the write prevention signal WP, based on the monitoring information MONITOR_INF received from the monitoring component (160 shown in FIG. 1), and output the write prevention signal WP to the memory controller (200 shown in FIG. 1).

In some implementations, the monitoring component (160 shown in FIG. 1) may monitor a state of the memory device (100 shown in FIG. 1), based on the temperature information TEM_INF representing a temperature measured by the temperature circuit (150 shown in FIG. 1). The monitoring component (160 shown in FIG. 1) may provide the operation controller (170 shown in FIG. 1) with monitoring information MONITOR_INF generated based on a monitoring result, and the operation controller (170 shown in FIG. 1) may generate the write prevention signal WP, based on the monitoring information MONITOR_INF.

In an embodiment, when the monitoring information MONITOR_INF includes information on a booting mode BT_MODE or a normal mode NM_MODE, the operation controller (170 shown in FIG. 1) may generate the write prevention signal WP of a high state and output the write prevention signal WP to the memory controller (200 shown in FIG. 1). The memory controller (200 shown in FIG. 1) may check that the memory device (100 shown in FIG. 1) operates in the booting mode BT_MODE or the normal mode NM_MODE, based on the received write prevention signal WP, and then output a command and/or data to the memory device (100 shown in FIG. 1).

When the monitoring information MONITOR_INF includes information on a protection mode PT_MODE, the operation controller (170 shown in FIG. 1) may generate the write prevention signal of a low state and output the write prevention signal to the memory controller (200 shown in FIG. 1). The memory controller (200 shown in FIG. 1) may check that the memory device (100 shown in FIG. 1) operates in the protection mode PT_MODE, based on the received write prevention signal WP, and then suspend the output of the command and/or the data to the memory device (100 shown in FIG. 1). Thus, when the memory device (100 shown in FIG. 1) operates in the protection mode PT_MODE, an operation such as a booting operation or any other operation being performed is suspended, and the memory controller (200 shown in FIG. 1) may suspend the output of the command and/or the data.

In another embodiment, when the monitoring information MONITOR_INF includes the information on the booting mode BT_MODE or the normal mode NM_MODE, the operation controller (170 shown in FIG. 1) may generate the write prevention signal WP of the low state. When the monitoring information MONITOR_INF includes the information on the protection mode PT_MODE, the operation controller (170 shown in FIG. 1) may generate the write prevention signal WP of the high state.

Figure 9:
FIG. 9 is a diagram illustrating a method of notifying an operation mode of the memory device through status information.

FIG. 9 is a diagram illustrating a method of notifying an operation mode of the memory device through status information.

Referring to FIGS. 6 and 9, FIG. 9 illustrates status information STATUS_INF which the operation controller (170 shown in FIG. 1) outputs to the memory controller (200 shown in FIG. 1). In FIG. 9, it is illustrated that the status information STATUS_INF includes ready busy information RB_INF and monitoring information MONITOR_INF. However, in another embodiment, a larger number of information may be included in the status information STATUS_INF.

In FIG. 9, the ready busy information RB_INF may represent whether the state of the memory device (100 shown in FIG. 1) is a ready state or a busy state, and the monitoring information MONITOR_INF may represent an operation mode of the memory device (100 shown in FIG. 1).

In an embodiment, the operation controller (170 shown in FIG. 1) may generate status information STATUS_INF, based on the monitoring information MONITOR_INF received from the monitoring component (160 shown in FIG. 1), and output the status information STATUS_INF to the memory controller (200 shown in FIG. 1). The status information STATUS_INF may be generated when the memory device (100 shown in FIG. 1) is reset, and be output to the memory controller (200 shown in FIG. 1). The resetting of the memory device (100 shown in FIG. 1) may be performed when the state of the memory device (100 shown in FIG. 1) is changed from a sleep state to a wakeup state, and the memory device (100 shown in FIG. 1) does not normally operate in the wakeup state.

In an embodiment, the monitoring component (160 shown in FIG. 1) may monitor a state of the memory device (100 shown in FIG. 1), based on the temperature information TEM_INF representing a temperature measured by the temperature circuit (150 shown in FIG. 1). The monitoring component (160 shown in FIG. 1) may provide the operation controller (170 shown in FIG. 1) with monitoring information MONITOR_INF generated based on a monitoring result, and the operation controller (170 shown in FIG. 1) may generate status information STATUS_INF, based on the monitoring information MONITOR_INF.

In an embodiment, the memory controller (200 shown in FIG. 1) may check an operation mode of the memory device (100 shown in FIG. 1), based on the status information STATUS_INF received from the operation controller (170 shown in FIG. 1) and then perform a subsequent operation.

For example, when the monitoring information MONITOR_INF included in the status information STATUS_INF includes information on a booting mode BT_MODE or a normal mode NM_MODE, the memory controller (200 shown in FIG. 1) may check that the memory device (100 shown in FIG. 1) operates in the booting mode BT_MODE or the normal mode NM_MODE, and then output a command and/or data to the memory device (100 shown in FIG. 1).

When the monitoring information MONITOR_INF included in the status information STATUS_INF includes information on a protection mode PT_MODE, the memory controller (200 shown in FIG. 1) may check that the memory device (100 shown in FIG. 1) operates in the protection mode PT_MODE, and then suspend the output of the command and/or the data to the memory device (100 shown in FIG. 1). Thus, when the memory device (100 shown in FIG. 1) operates in the protection mode PT_MODE, a booting operation or an operation being performed is suspended, and therefore, the memory controller (200 shown in FIG. 1) may suspend the output of the command and/or the data.

Figure 10:
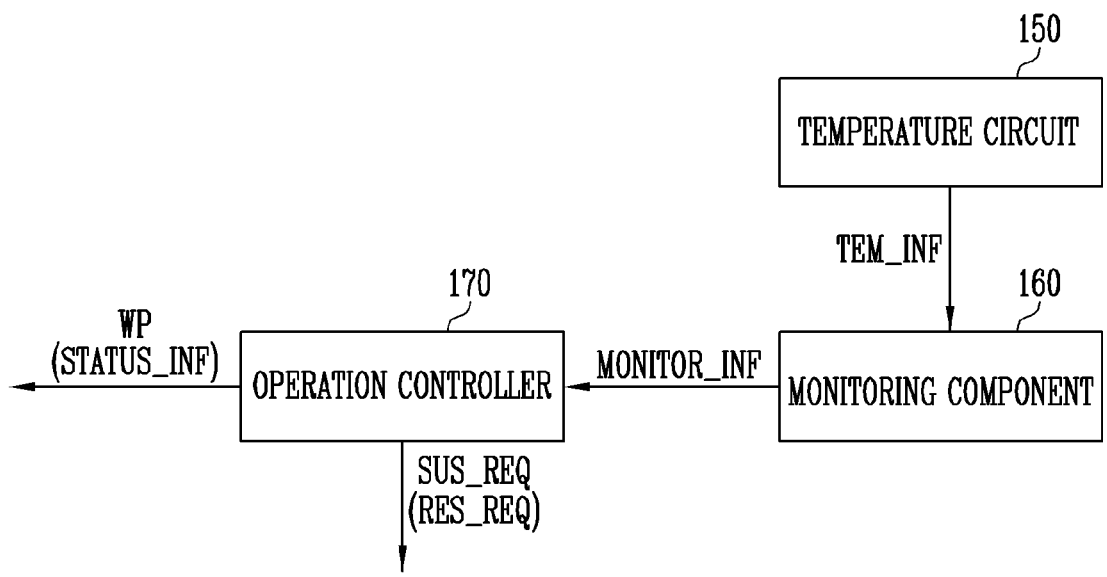
FIG. 10 is a diagram illustrating an operation of each component in a phase after booting based on some implementations of the disclosed technology.

FIG. 10 is a diagram illustrating an operation of each component in a phase after booting.

Referring to FIGS. 1 to 10, FIG. 10 illustrates the temperature circuit 150, the monitoring component 160, and the operation controller 170, which are included in the memory device (100 shown in FIG. 1). Also, FIG. 10 illustrates operations of the temperature circuit 150, the monitoring component 160, and the operation controller 170, which occur after the booting of the storage device (50 shown in FIG. 1), e.g., during a runtime. In the descriptions below, the runtime refers to a phase after the booting operation of the storage device.

In an embodiment, during the runtime, the temperature circuit 150 may measure a temperature of the memory device (100 shown in FIG. 1) for every predetermined period, and then provide the monitoring component 160 with temperature information TEM_INF including information on the measured temperature. The measured temperature may be within a predetermined temperature range or be out of the predetermined temperature range.

In an embodiment, the monitoring component 160 may monitor a state of the memory device (100 shown in FIG. 1), based on the temperature information TEM_INF. The monitoring component 160 may generate monitoring information MONITOR_INF, based on a monitoring result. The monitoring information MONITOR_INF may include information on a normal mode or a protection mode. The normal mode may be an operation mode of the memory device (100 shown in FIG. 1), in which an operation is continuously performed, and the protection mode may be an operation mode of the memory device (100 shown in FIG. 1), in which the operation is suspended.

The monitoring component 160 may provide the monitoring information MONITOR_INF to the operation controller 170 such that the memory device (100 shown in FIG. 1) operates in the normal mode or the protection mode.

For example, when the measured temperature is within the predetermined temperature range as a result determined based on the temperature information TEM_INF, the monitoring component 160 may provide the operation controller 170 with the monitoring information MONITOR_INF including the information on the normal mode.

However, when the measured temperature is out of the predetermined temperature range as a result determined based on the temperature information TEM_INF, the monitoring component 160 may provide the operation controller 170 with the monitoring information MONITOR_INF including the information on the protection mode.

In an embodiment, when the monitoring information MONITOR received from the monitoring component 160 includes the information on the normal mode in a state in which the memory device (100 shown in FIG. 1) is performing the operation, the operation controller 170 may not perform any separate operation.

However, when the monitoring information MONITOR received from the monitoring component 160 includes the information on the protection mode in a state in which the memory device (100 shown in FIG. 1) is performing the operation, the operation controller 170 may output a suspend request SUS_REQ. When the suspend request SUS_REQ is output, the memory device (100 shown in FIG. 1) may complete the operation being performed and suspend a subsequent operation.

Moreover, as described in FIGS. 8 and 9, when the monitoring information MONITOR_INF incudes the information on the protection mode, the operation controller 170 may output a write prevention signal WP or status information STATUS_INF to the memory controller (200 shown in FIG. 1), thereby notifying the memory controller (200 shown in FIG. 1) of that the memory device (100 shown in FIG. 1) operates in the protection mode.

In an embodiment, after the memory device (100 shown in FIG. 1) suspends the operation, the monitoring information MONITOR_INF received from the monitoring component 160 may include the information on the normal mode. After the operation controller 170 receives the monitoring information MONITOR_INF including the information on the normal mode, the operation controller 170 may output a resume request RES_REQ for requesting the memory device (100 shown in FIG. 1) to resume the suspended operation. When the resume request RES_REQ is output, the memory device (100 shown in FIG. 1) may again perform the suspended operation.

In some implementations, when the monitoring information MONITOR_INF includes the information on the normal mode, the operation controller 170 may output a write prevention signal WP or status information STATUS_INF to the memory controller (200 shown in FIG. 1), thereby notifying the memory controller (200 shown in FIG. 1) of that the memory device (100 shown in FIG. 1) again operates in the normal mode.

As described above, the temperature circuit 150 can measure a temperature of the memory device (100 shown in FIG. 1) for every predetermined period even during the runtime in addition to the booting of the memory device (100 shown in FIG. 1), and thus an operation during the runtime can be performed based on a measured result. Thus, it is determined whether the temperature measured during the runtime is within the predetermined temperature range. When the temperature measured during the runtime is out of the predetermined temperature range, the memory device (100 shown in FIG. 1) is controlled to operate in the protection mode, and that the memory device (100 shown in FIG. 1) operates in the protection mode is notified to the memory controller (200 shown in FIG. 1), so that a malfunction can be prevented.

Figure 11:
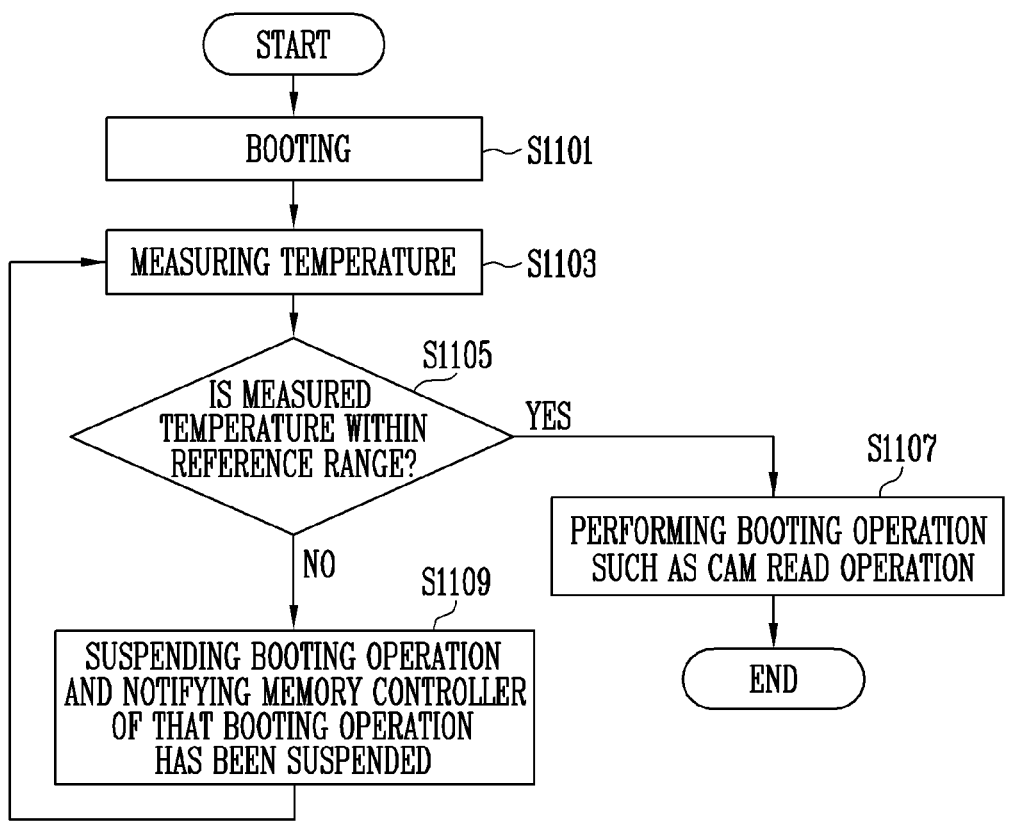
FIG. 11 is a diagram illustrating an operation of a memory device based on some implementations of the disclosed technology.

FIG. 11 is a diagram illustrating an operation of a memory device in accordance with an embodiment of the present disclosure.

Referring to FIG. 11, in step S1101, the memory device may be booted. When the memory device is booted, external power may be simultaneously supplied to the memory controller and the memory device.

In step S1103, the memory device may measure a temperature. Specifically, a temperature circuit included in the memory device may measure a temperature when the memory device is booted.

In step S1105, the memory device may determine whether the measured temperature is within a reference range. The reference range may be a range in which the memory device is not shut down but can normally operate. As a determination result, when the measured temperature is within the reference range (Y), the memory device may proceed to step S1107. As a determination result, when the measured temperature is out of the reference range (N), the memory device may proceed to step S1109.

In the step S1107, the memory device may perform a booting operation such as a CAM read operation. That is, when it is determined that the measured temperature is within the range in which the memory device is not shut down but can normally operate, the memory device may perform the booting operation.

In the step S1109, the memory device may suspend the booting operation, and notify the memory controller of that the booting operation has been suspended. That is, when it is determined that the measured temperature is a temperature at which the memory device may be shut down, the memory device may suspend the booting operation. Also, the memory device may notify the memory controller of that the booting operation has been suspended through a write prevention signal, status information, or the like.

In an embodiment, when the memory device suspends the booting operation, the memory device may measure a temperature by again proceeding to the step S1103.

The memory device may measure a temperature for every predetermined period. When the measured temperature becomes low or higher within the reference range, the memory device may again perform the booting operation. Moreover, the memory device may notify the memory controller of that the booting operation has been resumed through a write prevention signal, status information, or the like.

Figure 12:
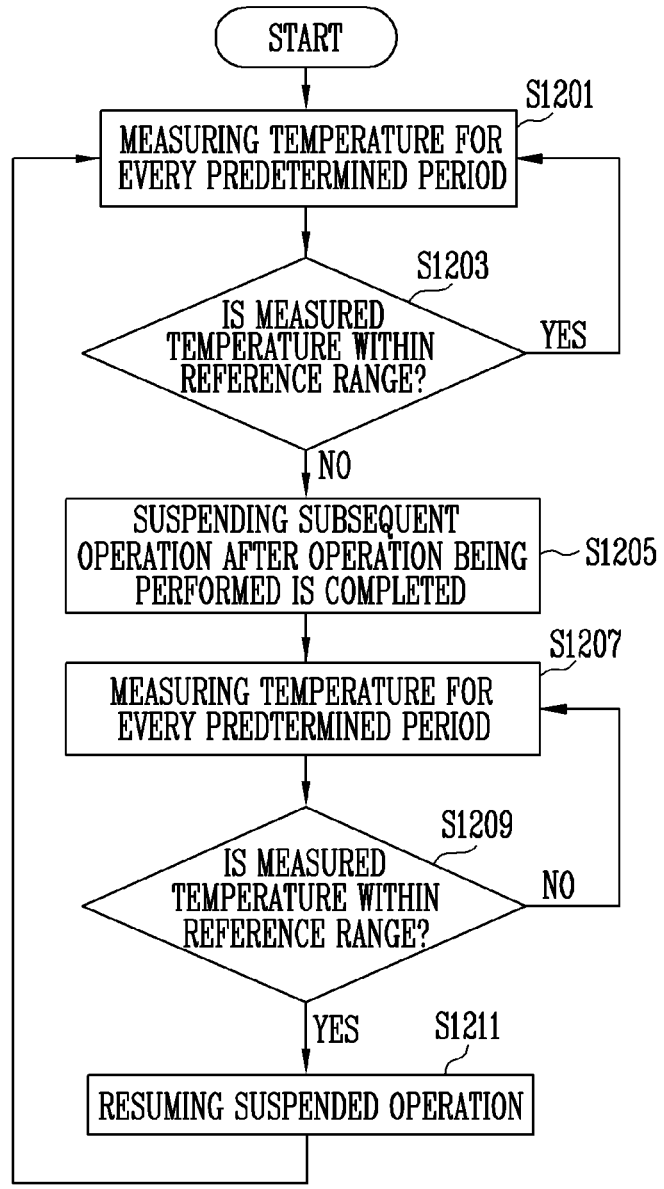
FIG. 12 is a diagram illustrating an operation of a memory device based on some implementations of the disclosed technology.

FIG. 12 is a diagram illustrating an operation of a memory device in accordance with an embodiment of the present disclosure.

Referring to FIG. 12, in step S1201, the memory device may measure a temperature for every predetermined period during a runtime. Specifically, a temperature circuit included in the memory device may measure a temperature during the runtime in addition to in booting.

In step S1203, the memory device may determine whether the measured temperature is within a reference range. Like in the booting, the reference range may be a range in which the memory device is not shut down but can normally operate.

As a determination result, when the measured temperature is within the reference range (Y), the memory device may again proceed to the step S1201. As a determination result, when the measured temperature is out of the reference range (N), the memory device may proceed to step S1205. That is, it is determined that the measured temperature is within the reference range, i.e., within the range in which the memory device is not shut down but can normally operate, the memory device may continuously perform an operation, and measure a temperature for every predetermined period.

In the step S1205, the memory device may suspend a subsequent operation after the operation being performed is completed. That is, when it is determined that the measured temperature is a temperature at which the memory device may be shut down, the memory device may suspend an operation after the operation being performed. Also, the memory device may notify the memory controller of that the operation has been suspended through a write prevention signal, status information, or the like.

In step S1207, the memory device may measure a temperature for every predetermined period. That is, the memory device may suspend the operation and then again measure a temperature for every predetermined period.

In step S1209, the memory device may determine whether the measured temperature is within the reference range. That is, after the memory device suspends the operation, the memory device may determine whether the measured temperature has become low or high within the reference range.

When the temperature measured in the step S1209 is within the reference range (Y), the memory device may proceed to step S1211. That is, when it is determined that the measured temperature is within the range in which the memory device is not shut down but can normally operate, the memory device may resume the suspended operation in the step S1211, and then measure a temperature for every predetermined period by again proceeding to the step S1201.

The memory device may notify the memory controller of that the suspended operation has been resumed through a write prevention signal, status information, or the like.

When the temperature measured in the step S1209 is not within the reference range (N), i.e., when the temperature measured in the step S1209 is out of the reference range, the memory device may again measure a temperature for every predetermined period by proceeding to the step S1207.

Figure 13:
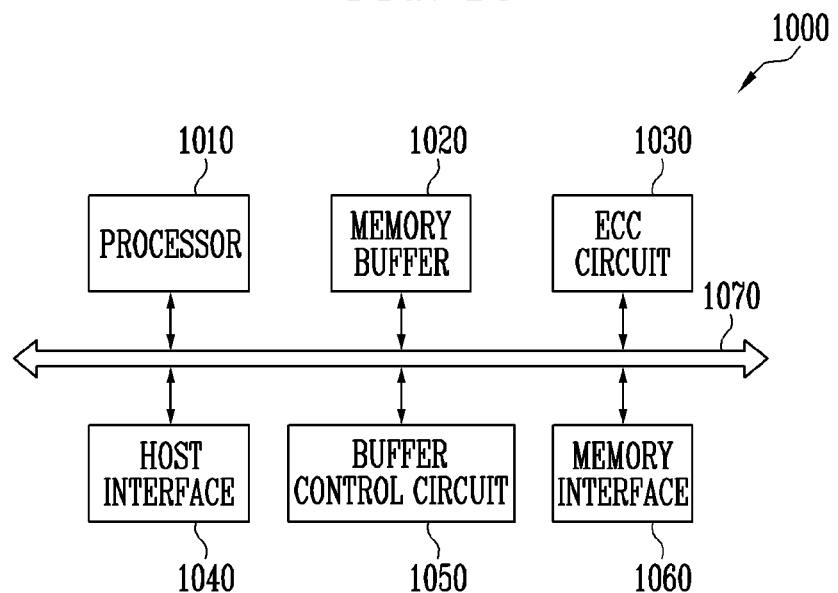
FIG. 13 is a diagram illustrating another embodiment of a memory controller shown in FIG. 1.

FIG. 13 is a diagram illustrating another embodiment of the memory controller shown in FIG. 1.

Referring to FIG. 13, a memory controller 1000 is connected to a host Host and a memory device. The memory controller 1000 is configured to access the memory device in response to a request received from the host Host. For example, the memory controller 1000 is configured to control read, program, erase, and background operations of the memory device. The memory controller 1000 is configured to provide an interface between the memory device and the host Host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address LBA provided by the host through the FTL into a physical block address PBA. The FTL may receive a logic block address LPA, using a mapping table, to be translated into a physical block address PBA. Several address mapping methods of the FTL exist according to mapping units. A representative address mapping method includes a page mapping method, a block mapping method, and a hybrid mapping method.

The processor 1010 is configured to randomize data received from the host Host. For example, the processor 1010 may randomize data received from the host Host, using a randomizing seed. The randomized data is provided as data to be stored to the memory device to be programmed in the memory cell array.

The processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may store data processed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. Exemplarily, the ECC circuit 1030 may be included as a component of the memory interface 1060 in the memory interface 1060.

The host interface 1040 may communicate with the external host under the control of the processor 1010. The host interface 1040 may communicate with the host Host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

Exemplarily, the memory controller 1000 may not include the memory buffer 1020 and the buffer control circuit 1050.

Exemplarily, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

Exemplarily, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

Figure 14:
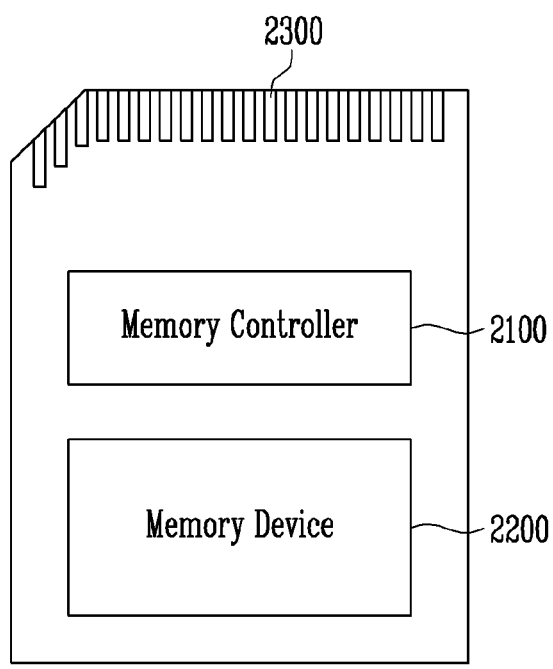
FIG. 14 is a block diagram illustrating a memory card system to which the storage device is applied based on some implementations of the disclosed technology.

FIG. 14 is a block diagram illustrating a memory card system to which the storage device is applied in accordance with an embodiment of the present disclosure.

Referring to FIG. 14, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory device 2200 may be implemented identically to the memory device 100 (100 shown in FIG. 1).

Exemplarily, the memory controller 2100 may include components such as a Random Access Memory (RAM), a processing unit, a host interface, a memory interface, and the error corrector.

The memory controller 2100 may communicate with an external device through the connector 2300. The memory controller 2100 may communicate with the external device (e.g., the host) according to a specific communication protocol. Exemplarily, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

Exemplarily, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

In an embodiment, a temperature circuit included in the memory device 2200 may measure a temperature in a booting or in a runtime after the booting, and the memory device 2200 may perform an operation according to the measured temperature.

Specifically, the temperature circuit may measure a temperature of the memory device 2200 in the booting. When the measured temperature is within a predetermined range, the memory device 2200 may continuously perform a booting operation.

However, when the measured temperature is out of the predetermined range, the memory device 2200 may suspend the booting operation. When the booting operation is suspended, the memory device 2200 may notify the memory controller 2100 of that the booting operation has been suspended through a write prevention signal or status information.

After the memory device 2200 suspends the booting operation, the temperature circuit may measure a temperature for every predetermined period. When the measured temperature is within the predetermined range, the memory device 2200 may resume the suspended booting operation. The memory device 2200 may notify the memory controller 2100 of that the booting operation has been resumed through a write prevention signal or status information.

In an embodiment, the temperature circuit may measure a temperature of the memory device 2200 in the runtime. When the measured temperature is within the predetermined range, the memory device 2200 may continuously perform the operation being performed.

However, when the measured temperature is out of the predetermined range, the memory device 2200 may complete the operation being performed and then suspend an operation from a next operation. The memory device 2200 may notify the memory controller 2100 of that the operation has been suspended through a write prevention signal or status information.

After the memory device 2200 suspends the operation, the temperature circuit may measure a temperature for every predetermined period. When the measure temperature is within the predetermined range, the memory device 2200 may resume the suspended operation. The memory device 2200 may notify the memory controller 2100 of that the operation has been resumed through a write prevention signal or status information.

Consequently, a temperature is measured in booting or in a runtime after the booting through the temperature circuit in the memory device 2200, and operations of the memory controller 2100 and the memory device 2200 are controlled based on the measured temperature, so that a malfunction in the booting or in the runtime can be prevented.

Figure 15:
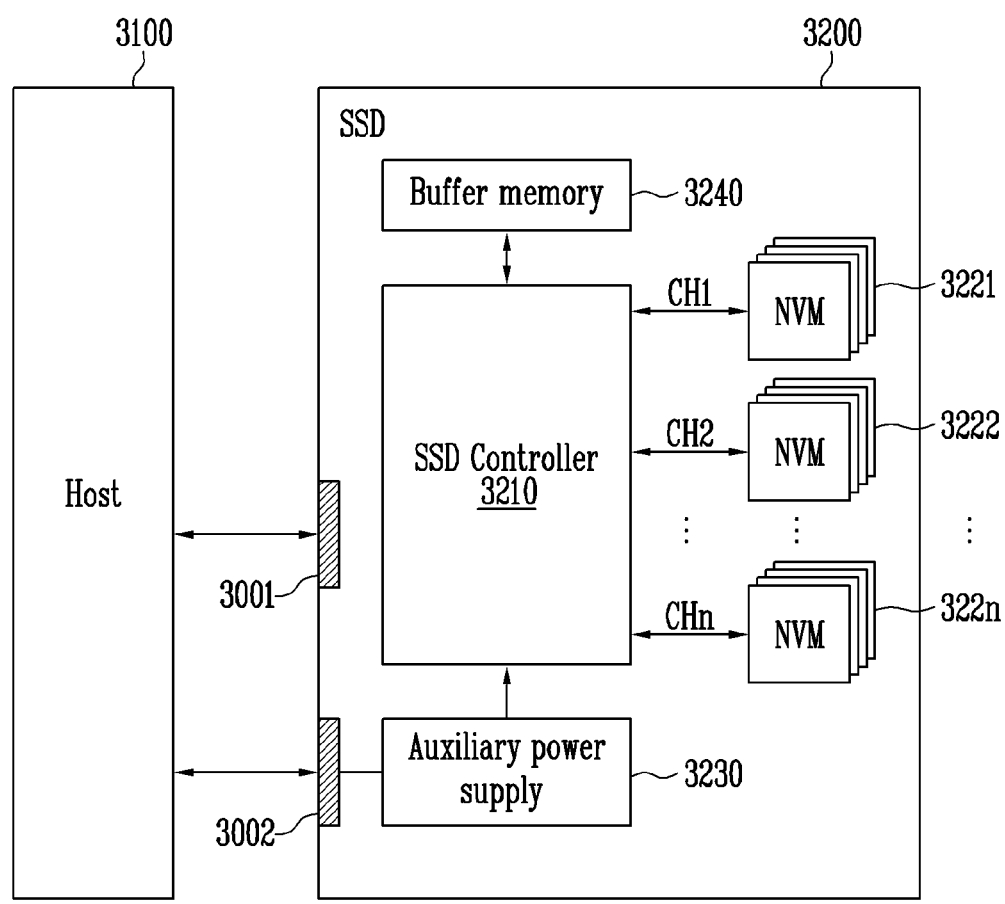
FIG. 15 is a block diagram illustrating a Solid State Drive (SSD) system to which the storage device is applied based on some implementations of the disclosed technology.

FIG. 15 is a block diagram illustrating a Solid State Drive (SSD) system to which the storage device is applied in accordance with an embodiment of the present disclosure.

Referring to FIG. 15, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322$n$, an auxiliary power supply 3230, and a buffer memory 3240.

In an embodiment, the SSD controller 3210 may serve as the memory controller (200 shown in FIG. 1).

The SSD controller 3210 may control the plurality of flash memories 3221 to 322$n$ in response to a signal SIG received from the host 3100. Exemplarily, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. Exemplarily, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. The auxiliary power supply 3230 may receive power PWR input from the host 3100 and charge the power PWR. For example, the buffer memory 3240 may temporarily store data received from the host 3100 or data received from the plurality of flash memories 3221 to 322$n$, or temporarily store meta data (e.g., a mapping table) of the flash memories 3221 to 322$n$. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In an embodiment, a temperature circuit included in each of the plurality of flash memories 3221 to 322n may measure a temperature in a booting or in a runtime after the booting, and each of the plurality of flash memories 3221 to 322n may perform an operation according to the measured temperature.

Specifically, the temperature circuit may measure a temperature of the plurality of flash memories 3221 to 322n in the booting. When the measured temperature is within a predetermined range, the plurality of flash memories 3221 to 322n may continuously perform a booting operation.

However, when the measured temperature is out of the predetermined range, the plurality of flash memories 3221 to 322n may suspend the booting operation. When the booting operation is suspended, the plurality of flash memories 3221 to 322n may notify the SSD controller 3210 of that the booting operation has been suspended through a write prevention signal or status information.

After the plurality of flash memories 3221 to 322n suspends the booting operation, the temperature circuit may measure a temperature for every predetermined period. When the measured temperature is within the predetermined range, the plurality of flash memories 3221 to 322n may resume the suspended booting operation. The plurality of flash memories 3221 to 322n may notify the SSD controller 3210 of that the booting operation has been resumed through a write prevention signal or status information.

In an embodiment, the temperature circuit may measure a temperature of the plurality of flash memories 3221 to 322n in the runtime. When the measured temperature is within the predetermined range, the plurality of flash memories 3221 to 322n may continuously perform the operation being performed.

However, when the measured temperature is out of the predetermined range, the plurality of flash memories 3221 to 322n may complete the operation being performed and then suspend an operation from a next operation. The plurality of flash memories 3221 to 322n may notify the SSD controller 3210 of that the operation has been suspended through a write prevention signal or status information.

After the plurality of flash memories 3221 to 322n suspends the operation, the temperature circuit may measure a temperature for every predetermined period. When the measure temperature is within the predetermined range, the plurality of flash memories 3221 to 322n may resume the suspended operation. The plurality of flash memories 3221 to 322n may notify the SSD controller 3210 of that the operation has been resumed through a write prevention signal or status information.

Consequently, a temperature is measured in booting or in a runtime after the booting through the temperature circuit in each of the plurality of flash memories 3221 to 322n, and operations of the SSD controller 3210 and the plurality of flash memories 3221 to 322n are controlled based on the measured temperature, so that a malfunction in the booting or in the runtime can be prevented.

Figure 16:
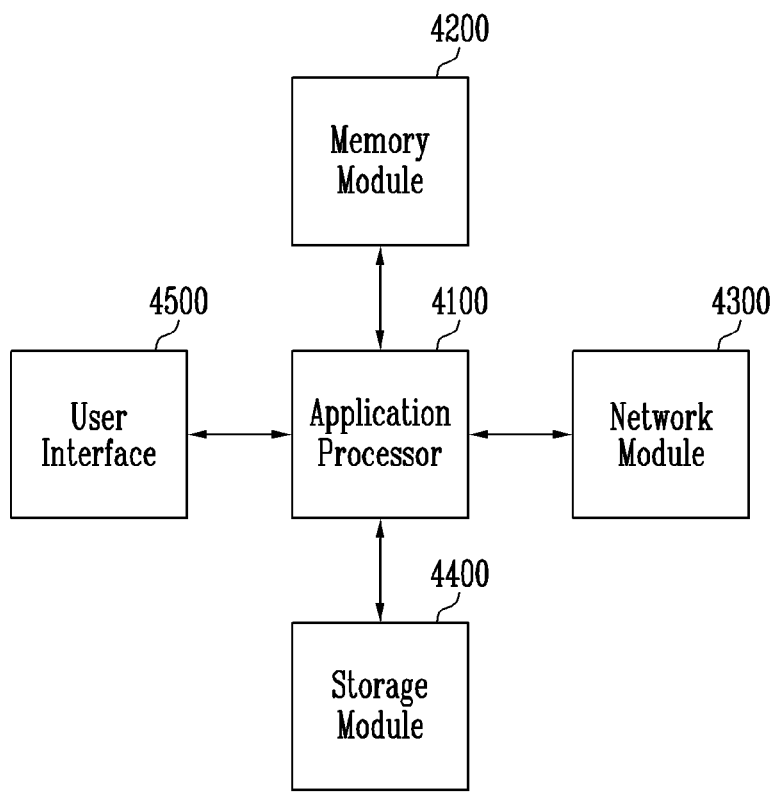
FIG. 16 is a block diagram illustrating a user system to which the storage device is applied based on some implementations of the disclosed technology.

FIG. 16 is a block diagram illustrating a user system to which the storage device is applied in accordance with an embodiment of the present disclosure.

Referring to FIG. 16, the user system 4000 includes an application processor 4100, a memory module 4200, a network module 4300, a storage module 4400, and a user interface 4500.

The application processor 4100 may drive components included in the user system 4000, an operating system (OS), a user program, or the like. Exemplarily, the application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRAM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. Exemplarily, the application processor 4100 and the memory module 4200 may be provided as one semiconductor package by being packaged based on a Package on Package (PoP).

The network module 4300 may communicate with external devices. Exemplarily, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. Exemplarily, the network module 4300 may be included in the application processor 4100.

The storage module 4400 may store data. For example, the storage module 4400 may store data received from the application processor 4100. Alternatively, the storage module 4400 may transmit data stored therein to the application processor 4100. Exemplarily, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. Exemplarily, the storage module 4400 may be provided as a removable drive such as a memory card of the user system 4000 or an external drive.

Exemplarily, the storage module 4400 may include a plurality of nonvolatile memory devices, and the plurality of nonvolatile memory devices may operate identically to the memory device described with reference to FIGS. 2 and 3. The storage module 4400 may operate identically to the storage device 50 described with reference to FIG. 1.

The user interface 4500 may include interfaces for inputting data or commands to the application processor 4100 or outputting data to an external device. Exemplarily, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In an embodiment, a temperature circuit included in the storage module 4400 may measure a temperature in a booting or in a runtime after the booting, and the storage module 4400 may perform an operation according to the measured temperature.

Specifically, the temperature circuit may measure a temperature of the storage module 4400 in the booting. When the measured temperature is within a predetermined range, the storage module 4400 may continuously perform a booting operation.

However, when the measured temperature is out of the predetermined range, the storage module 4400 may suspend the booting operation. When the booting operation is suspended, the storage module 4400 may notify the application processor 4100 of that the booting operation has been suspended through a write prevention signal or status information.

After the storage module 4400 suspends the booting operation, the temperature circuit may measure a temperature for every predetermined period. When the measured temperature is within the predetermined range, the storage module 4400 may resume the suspended booting operation. The storage module 4400 may notify the application processor 4100 of that the booting operation has been resumed through a write prevention signal or status information.

In an embodiment, the temperature circuit may measure a temperature of the storage module 4400 in the runtime. When the measured temperature is within the predetermined range, the storage module 4400 may continuously perform the operation being performed.

However, when the measured temperature is out of the predetermined range, the storage module 4400 may complete the operation being performed and then suspend an operation from a next operation. The storage module 4400 may notify the application processor 4100 of that the operation has been suspended through a write prevention signal or status information.

After the storage module 4400 suspends the operation, the temperature circuit may measure a temperature for every predetermined period. When the measure temperature is within the predetermined range, the storage module 4400 may resume the suspended operation. The storage module 4400 may notify the application processor 4100 of that the operation has been resumed through a write prevention signal or status information.

Consequently, a temperature is measured in booting or in a runtime after the booting through the temperature circuit in the storage module 4400, and operations of the application processor 4100 and the storage module 4400 are controlled based on the measured temperature, so that a malfunction in the booting or in the runtime can be prevented.

In accordance with the present disclosure, an operation is performed according to a temperature measured in booting, and an operation is performed according to a temperature measured after the booting, so that a malfunction of the memory device and a change in threshold voltage distribution of memory cells can be prevented.

What is claimed is:

1. A memory device comprising:
a plurality of memory cells;
a peripheral circuit configured to perform an operation on the plurality of memory cells;
a temperature circuit configured to measure a temperature of the memory device;
a monitoring component configured to generate, based on whether a measured temperature is within a reference range, monitoring information representing an operation mode that is either a normal mode in which the operation is performed or a protection mode in which the operation is suspended; and
an operation controller configured to output a signal for controlling the operation according to the monitoring information,
wherein the monitoring component is further configured to store the monitoring information and output the monitoring information to the operation controller in response to receiving the measured temperature from the temperature circuit.

2. The memory device of claim 1, wherein the temperature circuit is configured to measure the temperature of the memory device during a booting operation of the memory device.

3. The memory device of claim 1, wherein the monitoring component is further configured to generate the monitoring information representing the normal mode in response to receiving the measured temperature that is within the reference range.

4. The memory device of claim 1, wherein the monitoring component is further configured to generate the monitoring information representing the protection mode in response to receiving the measured temperature that is out of the reference range.

5. The memory device of claim 1, wherein the operation controller is further configured to output, to an external controller, status information or a signal notifying the operation mode of the memory device.

6. The memory device of claim 5, wherein the operation controller is further configured to output the status information to the external controller, upon detecting a reset operation of the memory device being performed.

7. The memory device of claim 1, wherein the temperature circuit is further configured to measure the temperature of the memory device after the booting operation of the memory device.

8. The memory device of claim 1, wherein the monitoring component is configured to provide an updated monitoring information corresponding to newly measured temperature received from the temperature circuit.

9. The memory device of claim 1, wherein the operation controller is configured to output the signal to perform, suspend, or resume the operation.

10. The memory device of claim 1, wherein the temperature circuit is configured to perform a first measuring of the temperature of the memory device in response to receiving power from an external device.

11. A method of operating a memory device, the method comprising:
starting a booting operation for booting the memory device;
measuring an initial temperature of the memory device in the booting operation;
generating, based on whether the initial temperature is within a reference range, monitoring information representing either a booting mode in which the booting operation is continuously performed or a protection mode in which the booting operation is suspended; and
outputting a request whether to continuously perform or suspend the booting operation based on the monitoring information.

12. The method of claim 11, further comprising: repeating measuring of a temperature of the memory device for a predetermined period.

13. The method of claim 12, further comprising: repeating generating of monitoring information based on a newly measured temperature and providing an updated monitoring information based on the newly measured temperature.

14. The method of claim 12, further comprising: outputting an updated request based on the updated monitoring information, the updated request resuming the booting operation or another operation that has been suspended.

15. The method of claim 11, wherein the repeating of the measuring of the temperature occurs during the booting operation or a runtime operation performed after the booting operation.

16. The method of claim 11, further comprising: outputting, to an external controller, status information or a signal notifying the operation mode of the memory device.

17. The method of claim 11, wherein the initial temperature is measured in response to receiving power from an external device.

18. A storage device comprising:
- a memory device including a plurality memory cells, each memory cell configured to store data; and
- a memory controller in communication with the memory device and configured to control an operation of the memory device, wherein the memory device is configured to measure a temperature of the memory device, generate and store monitoring information representing an operation mode that is either a normal mode in which the operation is performed or a protection mode in which the operation is suspended, and provide the memory controller with a signal representing the operation mode of the memory device that is either the normal mode or the protection mode, and wherein the signal is dependent on whether the temperature of the memory device is within a reference range.

19. The storage device of claim 18, wherein the memory device is further configured to repeat measuring of the temperature of the memory device for a predetermined period.

20. The storage device of claim 19, wherein the memory device is further configured to provide another signal representing an updated operation mode of the memory device based on whether a newly measured temperature of the memory device is within the reference range.

* * * * *